United States Patent
Sakai et al.

(10) Patent No.: US 7,148,820 B2
(45) Date of Patent: Dec. 12, 2006

(54) VARIABLE-LENGTH ENCODED DATA DECODING APPARATUS AND DECODING METHOD

(75) Inventors: Kenichiro Sakai, Kawasaki (JP); Tsugio Noda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 801 days.

(21) Appl. No.: 10/412,244

(22) Filed: Apr. 14, 2003

(65) Prior Publication Data

US 2003/0194012 A1 Oct. 16, 2003

(30) Foreign Application Priority Data

Apr. 15, 2002 (JP) .............................. 2002-111622

(51) Int. Cl.
*H03M 7/40* (2006.01)
(52) U.S. Cl. ........................................... 341/67; 341/50
(58) Field of Classification Search ................... 341/67; 375/240.03, 240.24
See application file for complete search history.

(56) References Cited

U.S. PATENT DOCUMENTS

| 2001/0054973 | A1* | 12/2001 | Kobayashi | 341/67 |
| 2002/0061063 | A1* | 5/2002 | Otto | 375/240.03 |

FOREIGN PATENT DOCUMENTS

| JP | 5-183443 | 7/1993 |
| JP | 6-53840 | 2/1994 |
| JP | 6-61870 | 3/1994 |
| JP | 6-326616 | 11/1994 |
| JP | 8-316847 | 11/1996 |

OTHER PUBLICATIONS

Notice of Rejection Grounds for corresponding Japanese Application No. 2002-111622 dated Feb. 28, 2006.
Decision to Rejection for corresponding Japanese Application No. 2002-111622 dated May 16, 2006.

* cited by examiner

*Primary Examiner*—Rexford Barnie
*Assistant Examiner*—Joseph Lauture
(74) *Attorney, Agent, or Firm*—Stass & Halsey LLP

(57) ABSTRACT

A variable-length encoded data decoding apparatus comprises: a common bit pattern length storing unit storing the bit lengths of common bit patterns that respectively correspond to groups, when codewords, whose bit lengths exclusive of the common bit patterns on the MSB sides are equal to or less than a predetermined value, among all of used codewords are classified into the groups in correspondence with the respective common bit patterns; a decoding table storing unit storing a table for storing the bit length and decoded data of a codeword in correspondence with the codeword within each of the groups; and an encoded data decoding unit decoding input variable-length encoded data by using the contents stored in the common bit pattern length storing unit, and the decoding table storing unit.

10 Claims, 21 Drawing Sheets

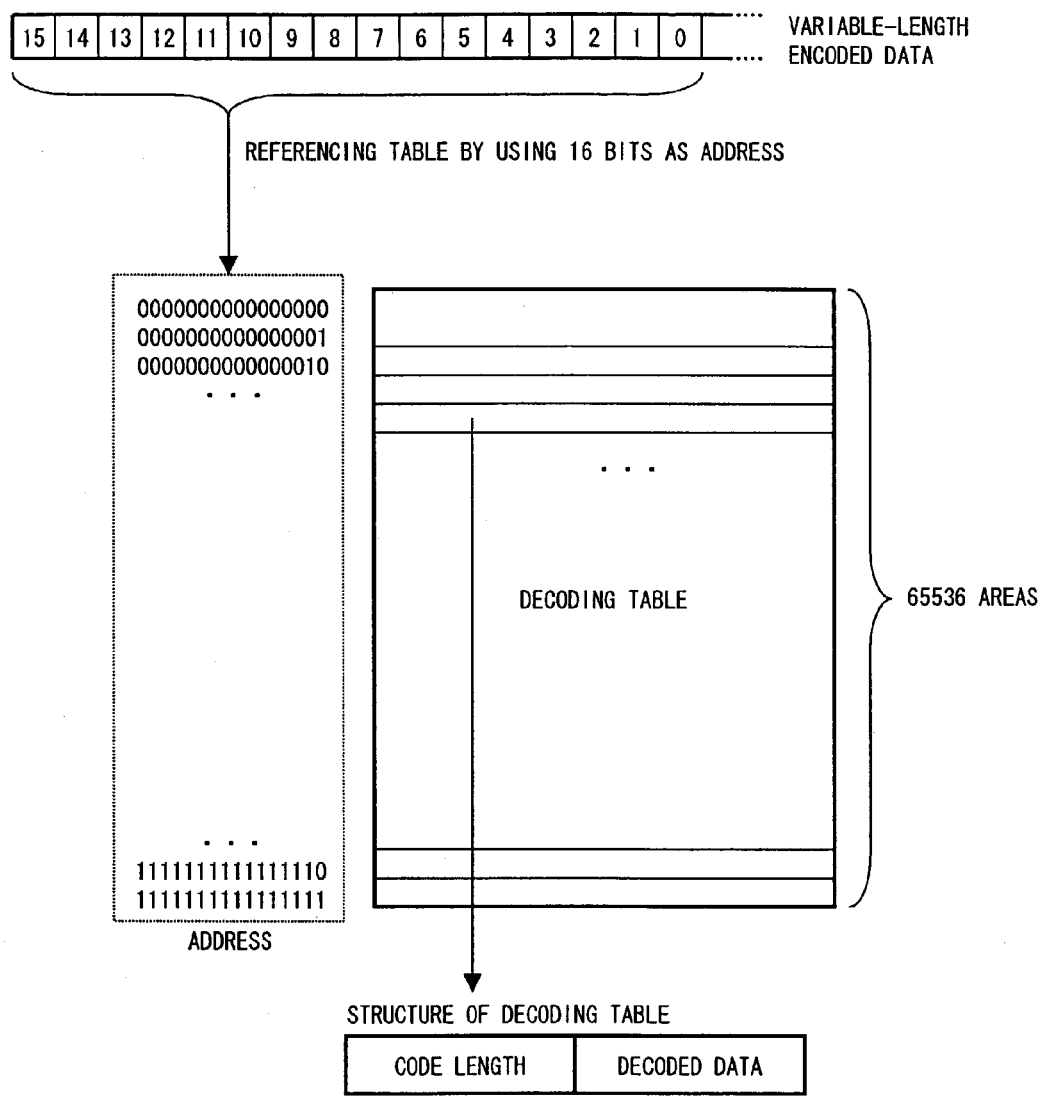
F I G. 1

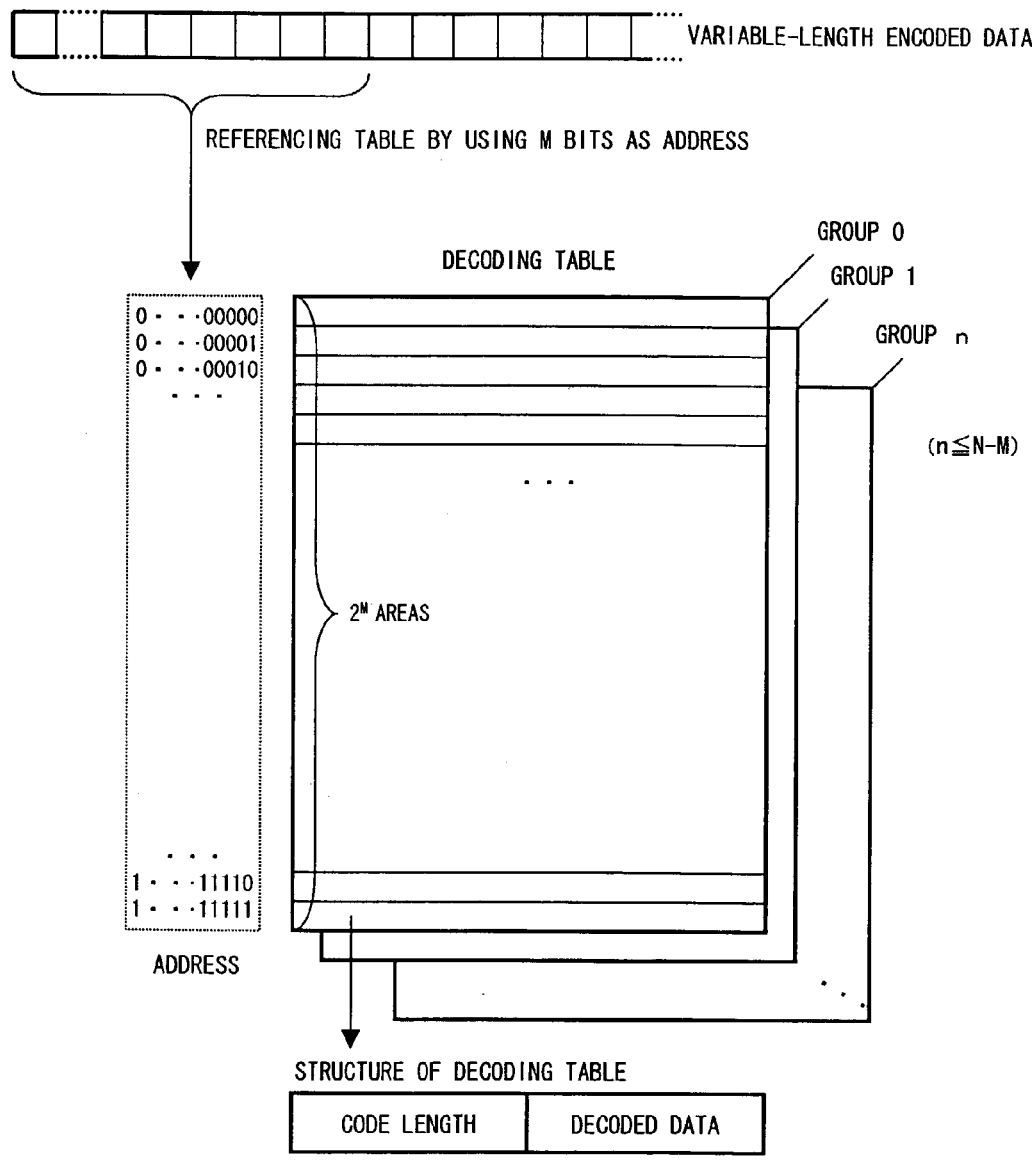
F I G. 4

COMMON BIT PATTERN LENGTH TABLE

| BIT LENGTH OF COMMON BIT PATTERN OF GROUP 0 |
|---|
| BIT LENGTH OF COMMON BIT PATTERN OF GROUP 1 |
| . . . |
|  |
| BIT LENGTH OF COMMON BIT PATTERN OF GROUP n |

FIG. 5

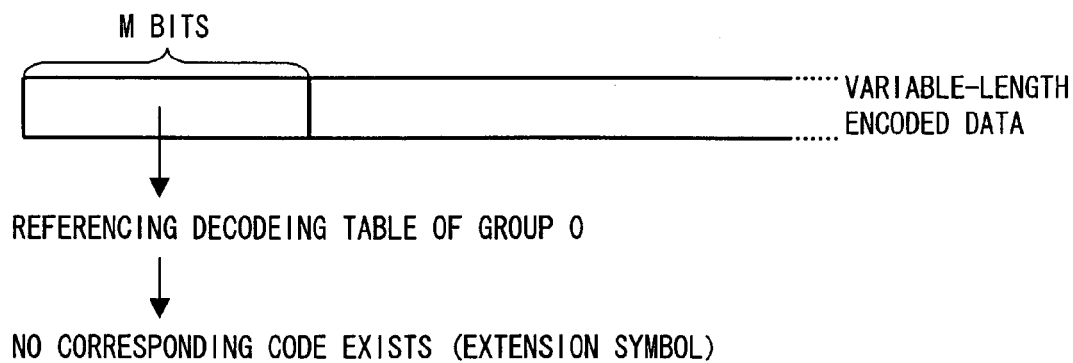
F I G. 7

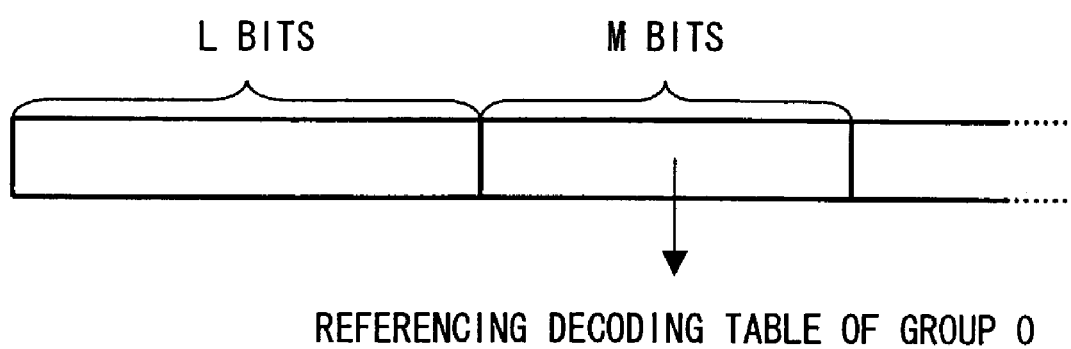
F I G. 9

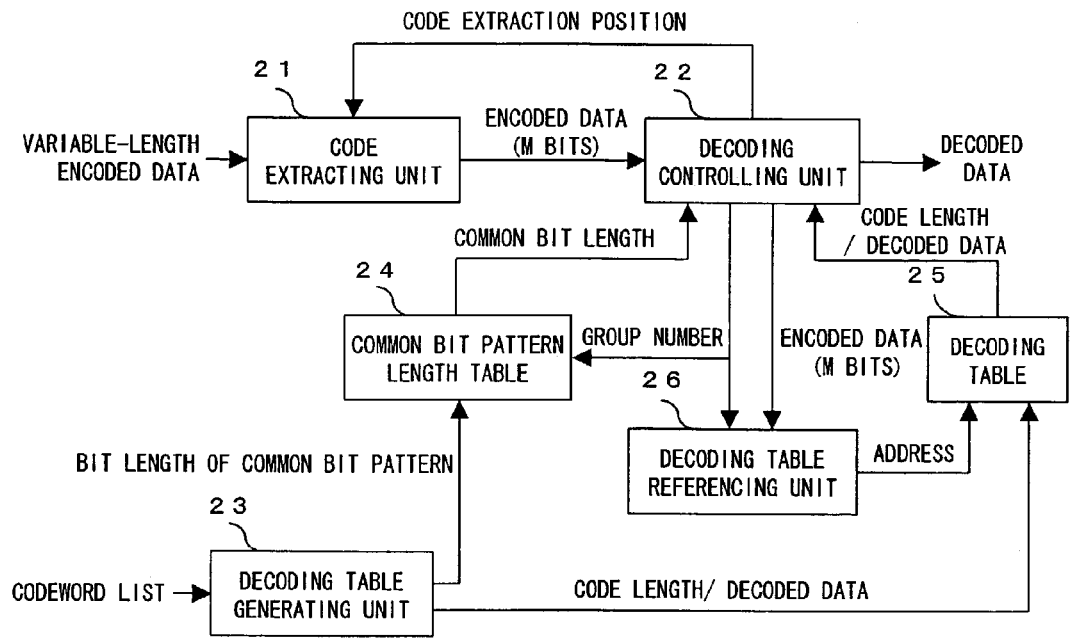
F I G. 10

| CODEWORD NUMBER | CODEWORD | | NUMBER OF BITS | GROUP NUMBER |
|---|---|---|---|---|
| 0 | 00 | | 2 | |
| 1 | 01 | | 2 | |
| 2 | 100 | | 3 | |
| 3 | 1010 | | 4 | 0 |
| ... | ... | | ... | |
| 16 | 11111001 | | 8 | |
| 17 | 11111010 | | 8 | |
| 18 | 11111 | 0110 | 9 | |
| 19 | 11111 | 0111 | 9 | |
| 20 | 11111 | 1000 | 9 | 1 |
| ... | ... | ← COMMON BITS | ... | |
| 34 | 11111 | 1110110 | 12 | |
| 35 | 11111 | 1110111 | 12 | |
| 36 | 111111111 | 000000 | 15 | |
| 37 | 111111111 | 0000010 | 16 | |
| ... | 111111111 | 0000011 | ... | 2 |
| 160 | ... | ← COMMON BITS | 16 | |
| 161 | 111111111 | 1111101 | 16 | |
| 162 | 111111111 | 1111110 | 16 | |

F I G. 1 2

| GROUP NUMBER | COMMON BIT LENGTH |
|---|---|
| 0 | 0 |
| 1 | 5 |
| 2 | 9 |

F I G. 1 4

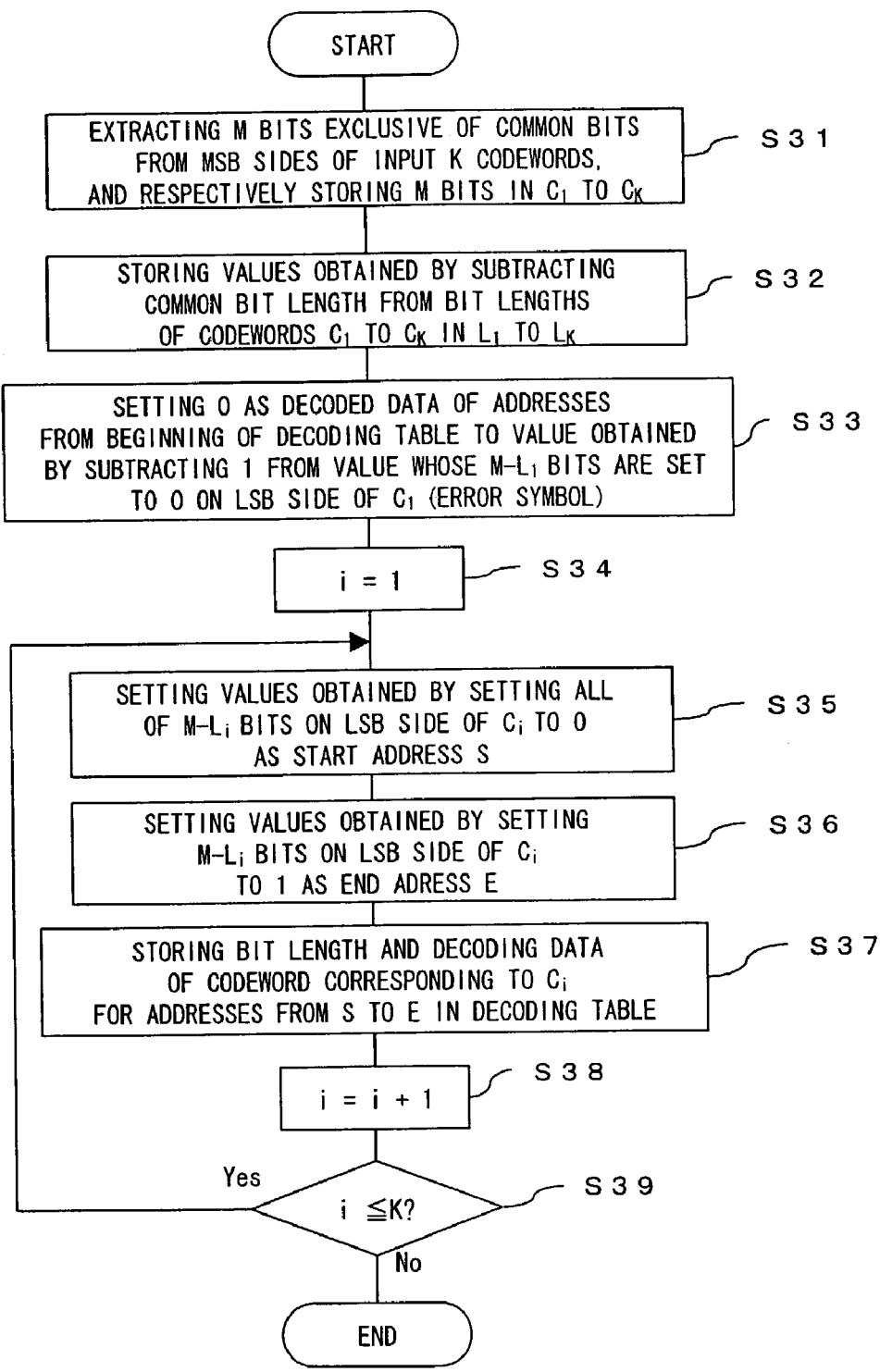
F I G. 15

| CODEWORD | ADDRESS | CODE LENGTH | DECODED DATA |
|---|---|---|---|
| UNEXISTING CODEWORD | 00000000 ... 01011111 | FF | 00 |
| 11111<u>0110</u> | 0110<u>0000</u> ... 0110<u>1111</u> | 9 | 14 |
| 11111<u>0111</u> | 0111<u>0000</u> ... 0111<u>1111</u> | 9 | 32 |
| 11111<u>1000</u> | 1000<u>0000</u> ... 1000<u>1111</u> | 9 | 81 |
| ... | ... | ... | ... |
| 111111<u>110110</u> | 11101100 11101101 | 12 | 62 |
| 111111<u>110111</u> | 11101110 11101111 | 12 | 72 |
| CODEWORD OF 13 BITS OR MORE | 11110000 ... 11111111 | FF | FF |

The "FF / 00" row is marked ERROR SYMBOL. The "FF / FF" row is marked EXTENTION SYMBOL.

F I G. 1 7

| CODEWORD | ADDRESS | CODE LENGTH | DECODED DATA |
|---|---|---|---|
| 00 | 00000000 ... 00111111 | 2 | 01 |
| 01 | 01000000 ... 01111111 | 2 | 02 |
| 100 | 10000000 ... 10011111 | 3 | 03 |
| 1010 | 10100000 ... 10101111 | 4 | 00 |
| ... | ... | ... | ... |
| 11111001 | 11111001 | 8 | 22 |
| 11111010 | 11111010 | 8 | 71 |
| CODEWORD OF 9 BITS OR MORE | 11111011 ... 11111111 | FF | FF |

EXTENTION SYMBOL

FIG. 18

| CODEWORD | ADDRESS | CODE LENGTH | DECODED DATA |
|---|---|---|---|
| 111111111000000 | 00000000<br>...<br>00000011 | 15 | 82 |
| 1111111110000010 | 00000100<br>00000101 | 16 | 09 |
| 1111111110000011 | 00000110<br>00000111 | 16 | 0A |
| ... | ... | ... | ... |
| 1111111111111101 | 11111010<br>11111011 | 16 | F9 |
| 1111111111111110 | 11111110<br>11111111 | 16 | FA |

FIG. 19

VARIABLE-LENGTH ENCODED DATA DECODING APPARATUS AND DECODING METHOD

BACKGROUND OF THE INVENTION

1. Field of the Invention

The present invention relates to a variable-length encoding system, and more particularly, to a variable-length encoded data decoding apparatus and decoding method, which can reduce the size of a table to be referenced when encoded data is decoded.

2. Description of the Related Art

As a method decoding variable-length data that is encoded, for example, with a Huffman encoding method in a short time, a method using a lookup table (LUT) is conventionally used. That is, a method decoding data by storing decoded data, which corresponds to variable-length encoded data, as a lookup table in a storage device such as a RAM, a ROM, etc., by extracting input variable-length encoded data with a fixed bit-length longer than the longest codeword length, and by referencing the lookup table.

Figure 1:
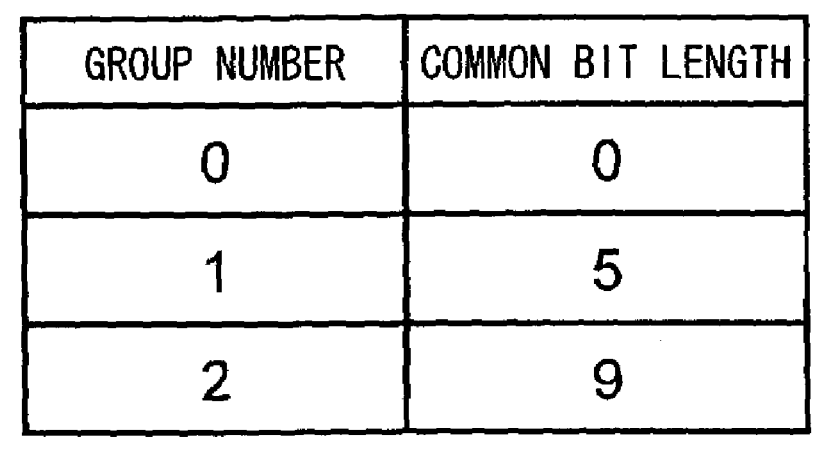

FIG. 1 explains such a method. In this figure, the longest code length of variable-length encoded data, for example, 16 bits are extracted, and a decoding table is referenced by using the data of the extracted 16 bits as an address. The decoding table stores a code length, and decoded data in correspondence with each address. By referencing an address, a code length and decoded data are obtained.

If the length of an actual codeword is, for example, 12 bits, the 12 bits, for instance, on the MSB side within the data of the extracted 16 bits are excluded from the input data as encoded data that is already decoded, and 16 bits to be referenced next as an address are extracted from the bit at the next position.

With such a conventional variable-length encoded data decoding method, decoded data must be stored in a lookup table in correspondence with all of combinations of data by the number of bits of the longest codeword length, leading to a significant increase in the size of the table.

For example, if variable-length encoded data whose longest codeword length is 16 bits is used as shown in FIG. 1, a lookup table for decoding is referenced by using the value of 16 bits extracted from the variable-length encoded data as an address, and decoded data, etc. must be stored in the table in correspondence with $2^{16}$ addresses, namely, 65536 addresses. If the bit length of a codeword and decoded data are respectively stored in 8 bits in correspondence with a general microprocessor, etc., the size of the table becomes 128 KB.

In the meantime, portable information appliances such as a cellular phone, a PDA (Personal Digital Assistant), etc. have become widespread in recent years. The capacity of a storage device such as a RAM, a ROM, etc., which is included in such information appliances, generally has been becoming small in terms of cost, weight reduction, etc. Accordingly, if variable-length encoded data is decoded with a conventional decoding method in such a portable information appliance, a large storage capacity is required due to a large table size, leading to increases in cost and an appliance size.

SUMMARY OF THE INVENTION

An object of the present invention is to provide a variable-length encoded data decoding apparatus and decoding method, which can reduce the size of a table used to decode variable-length encoded data, and can efficiently perform a decoding process by using a small memory capacity, in view of the above described problems.

A variable-length encoded data decoding apparatus according to the present invention comprises a common bit pattern length storing unit, a decoding table storing unit, and an encoded data decoding unit.

The common bit pattern length storing unit stores the bit lengths of common bit patterns that respectively correspond to groups, when codewords whose bit lengths exclusive of the common bit patterns on the MSB sides, in which all of bits are, for example, 1 or 0, or a mixture of 0 and 1, are equal to or less than a predetermined value among all of codewords used in a communication made, for example, by a portable information appliance are classified into the groups in correspondence with the respective common bit patterns.

The decoding table storing unit is intended to store a table for storing the bit lengths of codewords, and decoded data in correspondence with the codewords within each of the groups. The encoded data decoding unit decodes input encoded data by using the contents stored in the common bit pattern length storing unit and the decoding table storing unit.

According to the present invention, codewords whose bit lengths exclusive of common bit patterns on the MSB sides are equal to or less than a predetermined value among all of codewords used, for example, in a communication are classified into groups in correspondence with the respective common bit patterns, and variable-length encoded data is decoded by using a result of the grouping. As a result, the size of a table used to decode variable-length encoded data can be reduced, and a decoding process can be efficiently performed with a small memory capacity.

BRIEF DESCRIPTION OF THE DRAWINGS

FIG. 1 exemplifies a conventional variable-length encoded data decoding method;

FIG. 4 shows the structure of a decoding table according to the present invention;

FIG. 5 shows the contents stored in a common bit pattern length table;

FIG. 7 explains a fundamental decoding process (No. 1) for variable-length encoded data;

FIG. 9 explains a fundamental decoding process (No. 3) for variable-length encoded data;

FIG. 10 is a block diagram exemplifying the configuration of a variable-length encoded data decoding apparatus;

FIG. 12 exemplifies codewords used in a preferred embodiment;

FIG. 14 exemplifies a common bit pattern length table;

FIG. 15 is a flowchart showing a decoding table generation process;

FIG. 17 exemplifies a decoding table for a group 1;

FIG. 18 exemplifies a decoding table for a group 0;

FIG. 19 exemplifies a decoding table for a group 2;

DESCRIPTION OF THE PREFERRED EMBODIMENTS

Figure 2:
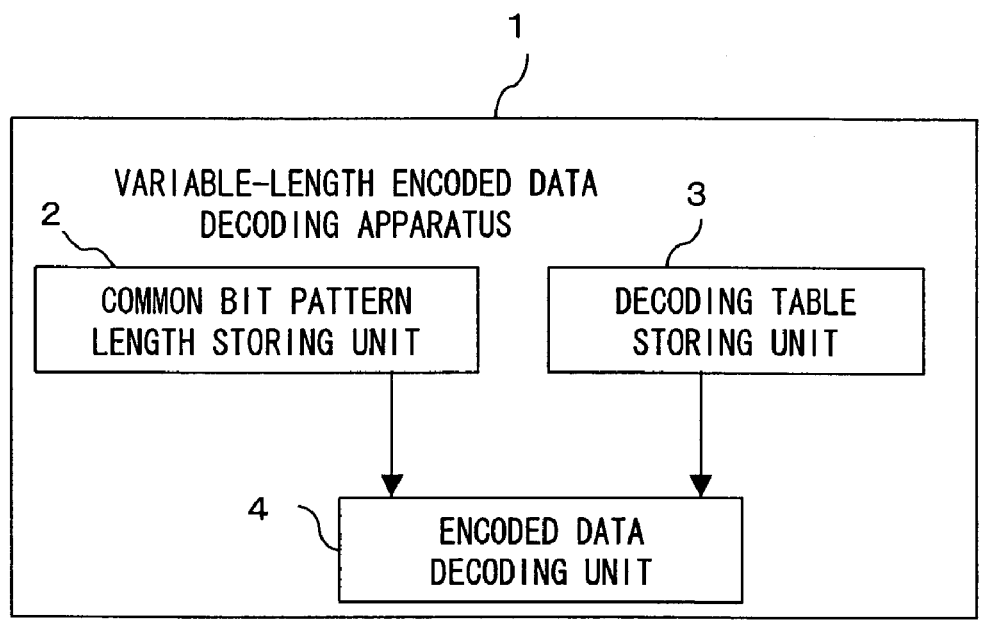
FIG. 2 is a block diagram showing the principle of the configuration of a variable-length encoded data decoding apparatus according to the present invention.

FIG. 2 is a block diagram showing the principle of the configuration of a variable-length encoded data decoding apparatus according to the present invention. This apparatus comprises a common bit pattern length storing unit 2, a decoding table storing unit 3, and an encoded data decoding unit 4.

The common bit pattern length storing unit 2 stores the bit lengths of common bit patterns respectively corresponding to groups, when codewords whose bit lengths exclusive of the common bit patterns on the MSB sides, in which all of bits are, for example, 1 or 0, or a mixture of 0 and 1, are equal to or less than a predetermined value among all of codewords used in a communication made, for example, by a portable information appliance are classified into the groups in correspondence with the respective common bit patterns.

The decoding table storing unit 3 is intended to store a table for storing the bit length and decoded data of a codeword in correspondence with the codeword within each of the groups. The encoded data decoding unit 4 decodes input encoded data by using the contents stored in the common bit pattern length storing unit 2 and the decoding table storing unit 3.

In a preferred embodiment according to the present invention, the decoding table storing unit 3 may also store a table for storing the bit length and decoded data of a codeword in correspondence with an address having, on the MSB side, a portion obtained by excluding a common bit pattern from the codeword in a group which corresponds to each of the above described common bit patterns, namely, in correspondence with an address having a bit length of the above described predetermined value.

In this case, the decoding table storing unit 3 may also store an extension symbol as decoded data corresponding to adresses in the lowest-order side address range among addresses which do not correspond to codewords belonging to a group, and may also store an error symbol as decoded data corresponding to adresses in the highest-order side address range among addresses which do not correspond to codewords belonging to a group. At this time, the encoded data decoding unit 4 decodes input encoded data by using a table for the common bit pattern second longest to the common bit pattern corresponding to the table in which the extension symbol is stored upon detection of the extension symbol when decoding the input encoded data, or may determine a data decoding error upon detection of the error symbol when decoding input encoded data.

Additionally, in the preferred embodiment, the bit length of the above described predetermined value, namely, the bit length of an address may be set as a multiple of 4.

As a variable-length encoded data decoding method according to the present invention, a method classifying codewords, whose bit lengths exclusive of common bit patterns on the MSB sides are equal to or less than a predetermined value, among all of used codewords into groups in correspondence with the respective common bit patterns, generating a common bit pattern length table for storing the bit lengths of the common bit patterns respectively corresponding to the groups, generating a decoding table for storing the bit length and decoded data of a codeword in correspondence with the codeword within each of the groups, and decoding input encoded data by using the contents stored in the common bit pattern length table and the decoding table.

In a preferred embodiment according to the present invention, in the generation of a decoding table by the variable-length encoded data decoding method, the bit length and decoded data of a codeword may be stored in correspondence with an address having a portion exclusive of a common bit pattern on the MSB side, in a similar manner as in the variable-length encoded data decoding apparatus.

In this case, in the generation of the decoding table, an extension symbol or an error symbol may be stored in correspondence with an address which does not correspond to a codeword belonging to a group as described above. At this time, input encoded data may be decoded by using a table for the second longest common bit pattern upon detection of the extension symbol when the encoded data is decoded, or a data decoding error may be determined upon detection of the error symbol.

Additionally, in the grouping of codewords, the bit length of a predetermined value may be a multiple of 4.

Furthermore, as a program for decoding variable-length encoded data in a preferred embodiment, a program for causing a computer to execute the above described variable-length encoded data decoding method may be available, and also a computer-readable portable storage medium on which is recorded such a program may be available.

As described above, according to the present invention, codewords, whose bit lengths exclusive of common bit patterns on the MSB sides are equal to or less than a predetermined value, among all of codewords used, for example, in a communication are classified into groups in correspondence with the respective common bit patterns, and variable-encoded data is decoded by using a result of the grouping.

Hereinafter, the preferred embodiments according to the present invention are described in further detail.

Figure 3:
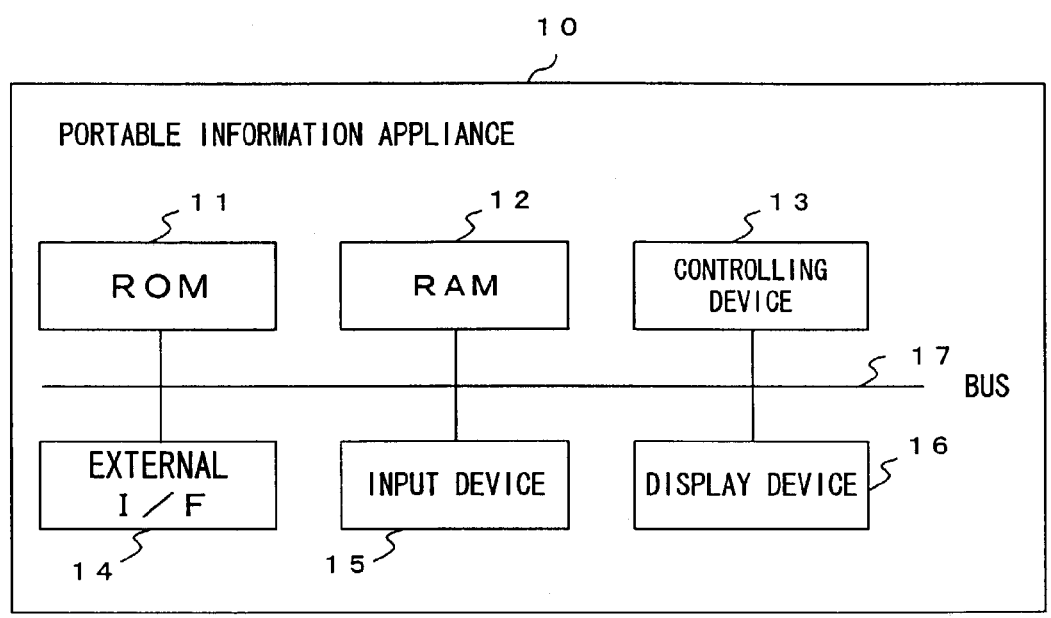
FIG. 3 is a block diagram exemplifying the configuration of a portable information appliance.

FIG. 3 is a block diagram exemplifying the configuration of a portable information appliance to which the variable-length encoded data decoding method according to the present invention is applied. As described above, such a portable information appliance generally has a small memory capacity, and is considered as one of representative appliances to which the present invention is applied.

In FIG. 3, programs and data which is not required to be changed are stored in a read-only memory (ROM) 11. According to the present invention, programs for executing a decoding table generation process and a variable-length encoded data decoding process, which will be described later, and the like are stored. Additionally, in a random access memory (RAM) 12, a storage area for temporarily used data, like a working area for executing a program is arranged, and a common bit pattern length table and decoding tables, which will be described later, and the like are stored.

A controlling device 13 corresponds to a CPU or an MPU. The controlling device 13 executes the programs stored in the ROM 11, so that the common bit pattern length table and decoding table generation process, and the decoding process for input variable-length encoded data are performed.

An external interface (I/F) 14 is intended to externally transmit/receive data, and corresponds to, for example, a wired or wireless interface, a memory card, etc. A list of codewords used in a portable information appliance 10 is input from the external I/F 14. The controlling device 13 executes the program for the decoding table generation process, which is stored in the ROM 11, generates decoding tables and a common bit pattern length table in correspondence with the input list of codewords, and stores the generated tables in the RAM 12.

Additionally, the controlling device 13 executes the program for the variable-length data decoding process, which is stored in the ROM 11, decodes input variable-length encoded data by referencing the decoding tables stored in the RAM 12, and stores a decoding result in the RAM 12 or outputs the result from the external I/F 14.

An input device 15 is intended to receive, for example, an instruction from an operator or a user, and is, for example, a touch panel or an operation panel on which a push-type switch is arranged. A display device 16 is intended to display data for an operator or a user, and is, for example, an LCD. A bus 17 is intended to mutually transmit/receive data or an instruction signal among all of the constituent elements from the ROM 11 to the display device 16.

Fundamental process of the variable-length encoded data decoding method according to the present invention are described next with reference to FIGS. 4 to 9. FIGS. 4 and 5 respectively explain decoding tables and a common bit pattern length table in this preferred embodiment. In FIG. 4, the decoding tables are generated by the number of groups. Here, a group is a set of codewords having a common bit pattern on the MSB sides among all of used codewords. In this figure, such groups exist by n+1, and also the decoding tables exist by n+1.

Before input variable-length encoded data is decoded, the decoding tables and the common bit pattern length table shown in FIG. 5 are generated by targeting all of used codewords. Codewords whose bit lengths exclusive of common bit patterns, in which all of bits are, for example, 1 or 0, or a mixture of 0 and 1, are equal to or less than, for example, a predetermined number of bits M, such as 4 bits, 8 bits, ... as multiples of 4 among all of codewords are classified into groups of the respective multiples.

Then, the decoding tables using addresses having a portion exclusive of the common bit patterns on the MSB sides within the respective groups, and the common bit pattern length table for storing the bit lengths of the common bit patterns of the respective groups are generated. The size of a decoding table for each of the groups, namely, the number of addresses is $2^M$, and a code length and decoded data are stored in correspondence with each of the addresses.

An upper portion of FIG. 4 shows that M bits in the initial portion of variable-length encoded data are extracted to first reference a decoding table of a group where a common bit pattern does not exist, namely, a group 0, when the variable-length encoded data to be decoded is input, and the decoding table of the group 0 is referenced by using the extracted M bits as an address. These operations will be further described later.

In FIG. 5, the bit lengths of common bit patterns of groups 0 to n, which respectively correspond to the n+1 decoding tables shown in FIG. 4, are stored. Here, the number of generated decoding tables may vary depending on an example of codewords used in a communication made, for instance, by a portable information appliance. If the number of bits of a codeword having the largest number of bits (the longest codeword) is N, the number of decoding tables results in N−M+1 at the maximum. For example, if M is set to 8 bits when the largest number of bits N is 16, the number of decoding tables results in 9 at the maximum.

Figure 6:
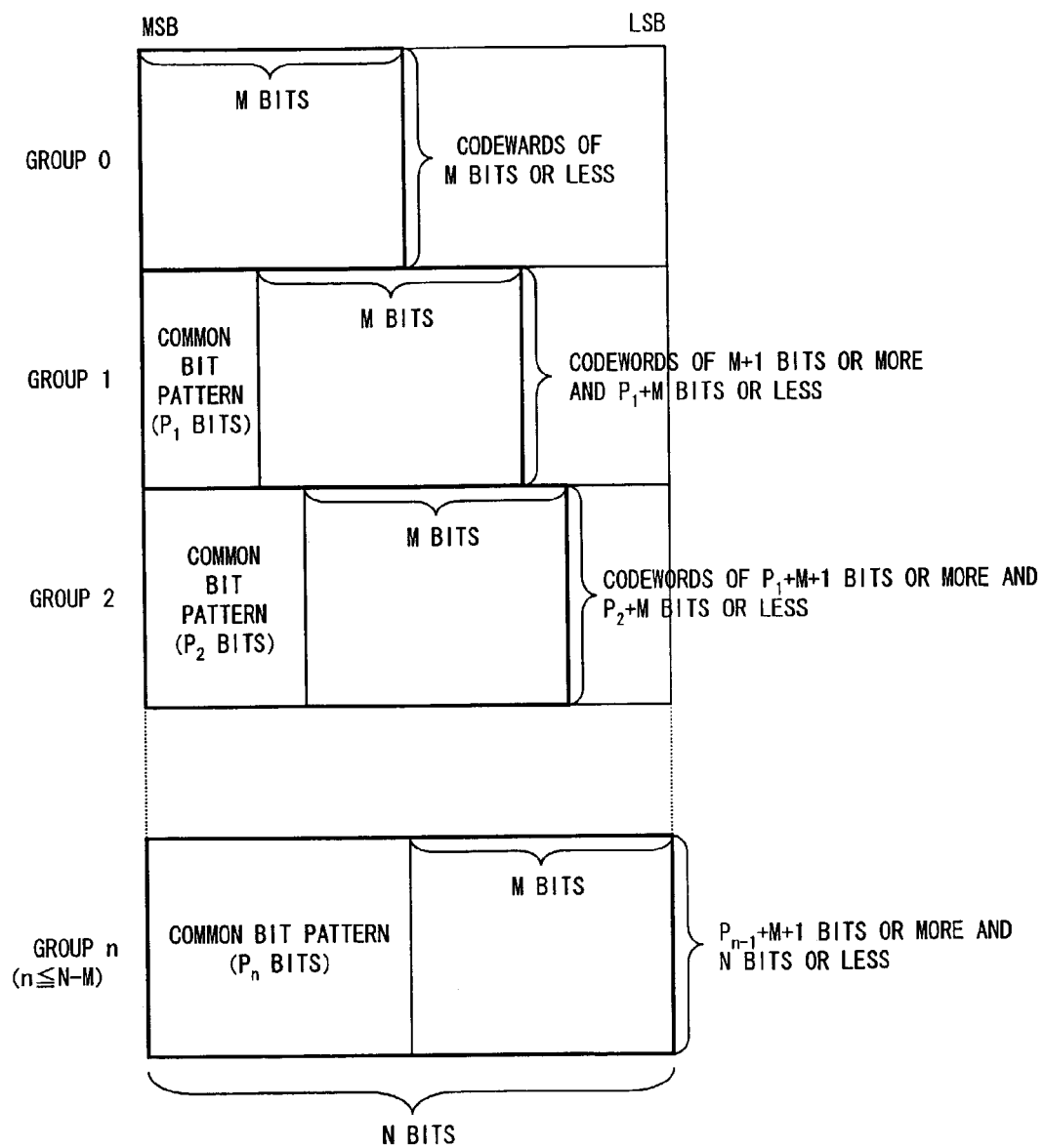
FIG. 6 explains the grouping of variable-length codewords.

FIG. 6 explains the grouping of variable-length codewords used. In this grouping process, all of the variable-length codewords used are arranged in ascending order so as to align the MSB sides, codewords whose bit lengths exclusive of common bit patterns on the MSB sides are equal to or less than M bits, for example, 8 bits are classified into groups, and decoding tables are generated respectively for the groups.

Namely, codewords included in the group 0 in FIG. 6 are respectively configured by data of M bits or less where a common bit pattern does not exist. If the bit length of a common bit pattern of the group 1 is $P_1$ bits, the bit lengths of codewords configuring the group 1 are equal to or more than M+1 bits, and equal to or less than $P_1+M$ bits.

As described above, in the decoding tables shown in FIG. 4, the addresses having, on the MSB sides, a portion of a bit length equal to or less than the M bits exclusive of a common bit pattern of codewords included in each of the groups are used, and the decoding tables are generated by storing a code length and decoded data of a corresponding codeword for each of the addresses.

As will be described later, if a codeword belonging to a group does not exist in the lowest-order side address range in a decoding table for each group, an extension symbol such as "FF" is stored as decoded data corresponding to an address in that range. Similarly, if a codeword belonging to a group does not exist in the highest-order side address range, an error symbol such as "00" is stored as decoded data.

Accordingly, if a decoding table corresponding to the bit length of extracted encoded data is referenced in correspondence with a codeword having an original length longer than the extracted encoded data when decoding encoded data, the extension symbol is obtained. As a result, a decoding table can be selected according to the bit length of the codeword. Or, if input variable-length encoded data corresponds to an unused codeword, the error symbol is obtained. As a result, an illegal codeword that is not used in a portable information appliance is detected, and a suitable error process can be performed.

Figure 8:
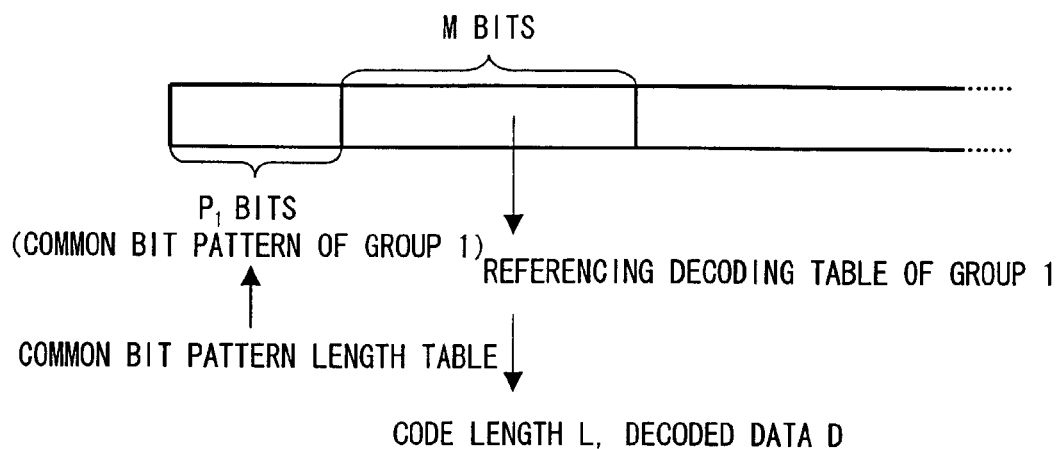
FIG. 8 explains a fundamental decoding process (No. 2) for variable-length encoded data.

FIGS. 7 to 9 explain such data decoding operations. In FIG. 7, M bits are extracted from the beginning of variable-length encoded data, and the decoding table of the group 0 is referenced, when the variable-length encoded data is decoded. If the original code length to be decoded is equal to or less than M bits, the code length and the decoded data, which correspond to the encoded data, are obtained. Here, assume that the M bits are shorter than the bit length of the original codeword to be decoded, and an extension symbol is therefore obtained when the decoding table of the group 0 is referenced.

In FIG. 8, since the extension symbol is obtained in FIG. 7, the original codeword to be decoded is determined to have a bit length equal to or more than M+1 bits, a bit length $P_1$ of the common bit pattern of the group 1 is obtained from the common bit pattern length table, data of M bits is extracted from the position proceeded by $P_1$ bits from the beginning of the variable-length encoded data, and the decoding table of the group 1 is referenced by using the extracted data of the M bits as an address. If the bit length of the original codeword to be decoded is equal to or less than $P_1+M$, a code length L and decoded data D are obtained.

FIG. 9 explains the next decoding operation. Because the code length L of the original codeword to be decoded is obtained in FIG. 8, M bits are extracted to again reference the decoding table of the group 0 from the position proceeded by L bits from the beginning of the variable-length encoded data shown in FIG. 7, and the operations explained with reference to FIGS. 7 and 8 are performed in FIG. 9.

If the bit length of the codeword to be decoded is equal to or more than $P_1+M+1$ in FIG. 8, an extension symbol is again obtained as a result of referencing the decoding table of the group 1. Therefore, the above described operations are repeated until a code length and decoded data are obtained, and the decoding table of the next group is referenced.

The decoding process according to this preferred embodiment is further described in detail with reference to FIGS. 10 to 20. FIG. 10 is a block diagram exemplifying the configuration of the variable-length encoded data decoding apparatus. In this figure, a code extracting unit 21 extracts encoded data of M bits from input variable-length encoded data. This code extraction position is instructed by a decoding controlling unit 22.

A decoding table generating unit 23 generates a common bit pattern length table 24 and decoding tables 25 by using a list of all of variable-length codewords used, namely, a codeword list.

The encoded data of M bits extracted by the code extracting unit 21 in correspondence with the input variable-length encoded data is provided to the decoding controlling unit 22, and the decoding controlling unit 22 provides the encoded data of M bits to a decoding table referencing unit 26. At this time, a group number is provided to both the common bit pattern length table 24 and the decoding table referencing unit 26.

A common bit length corresponding to the group number is provided from the common bit pattern length table 24 to the decoding controlling unit 22. The decoding tables 25 are then referenced by the decoding table referencing unit 26 with the use of the encoded data of M bits, which is provided from the decoding controlling unit 22, as an address, resultant code length and decoded data are provided to the decoding controlling unit 22, and the decoded data is externally output.

Even an illegal codeword that is not used as described above can be possibly decoded as a legal codeword because a change occurs in the value of a certain bit due to an error during a communication, and decoded data can be possibly output from the decoding controlling unit 26. In such a case, an inappropriate result is brought by subsequent processes, and a process as an error is performed finally.

Figure 11:
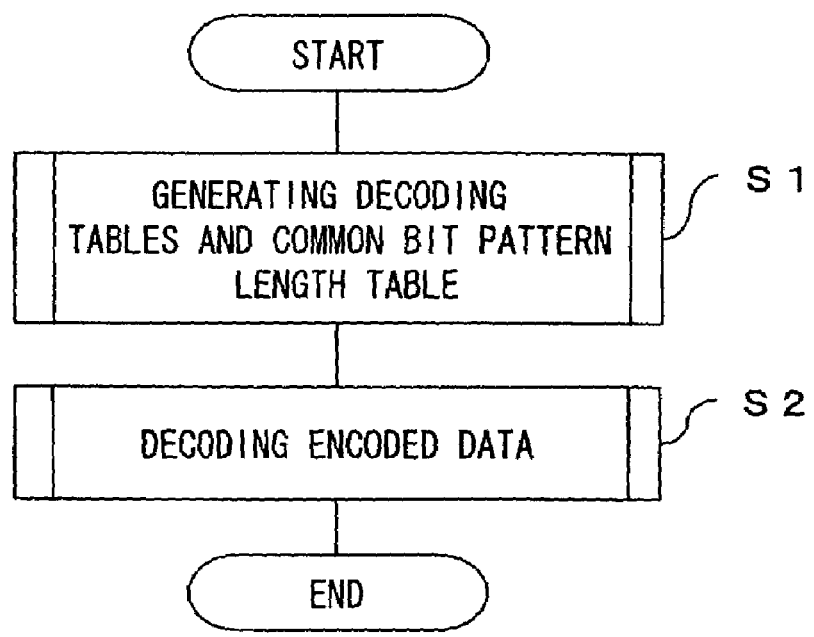
FIG. 11 is a flowchart showing the whole of processing performed by a variable-length encoded data decoding apparatus.

FIG. 11 is a flowchart showing the whole of processing performed by the variable-length encoded data decoding apparatus according to this preferred embodiment. When the processing is started in this figure, decoding tables and a common bit pattern length table are first generated in step S1. This process is performed by the decoding table generating unit 23 in correspondence with an input of a codeword list in FIG. 10.

Next, in step S2, input variable-length encoded data is decoded. This process is performed by the code extracting unit 21, the decoding controlling unit 22, and the decoding table referencing unit 26.

FIG. 12 shows a list of codewords for explaining this preferred embodiment, namely, all of variable-length codewords used. Here, 163 codewords are used in total as the number of codewords. Codewords of 2 to 8 bits (codewords having numbers 0 to 17), codewords of 9 to 12 bits (codewords having numbers 18 to 35), and codewords of 15 to 16 bits (codewords having numbers 36 to 162) are respectively classified as groups 0, 1, and 2. The number of bits of the common bit pattern of the group 1, namely, the number of bits of the common bit pattern where all of bits are 1 is 5, and the number of bits of the common bit pattern of the group 2 is 9.

The codewords shown in FIG. 12 can be represented as the shape of a tree where 0 and 1 are used as nodes. A common bit pattern where all of bits are 1 indicates that nodes of 1 are traced initially. Inversely, if many nodes of 0 are traced, a common bit pattern becomes a pattern where all of bits are 0.

In this preferred embodiment, codewords are selected not to obtain the same decoded data as that of a previously used codeword at the time of decoding, when a tree is traced. For example, if "000" or "001" is used as a codeword, it is determined as the codeword "00" having the number 0, and is decoded as will be described later. Therefore, such codewords are not used.

Figure 13:
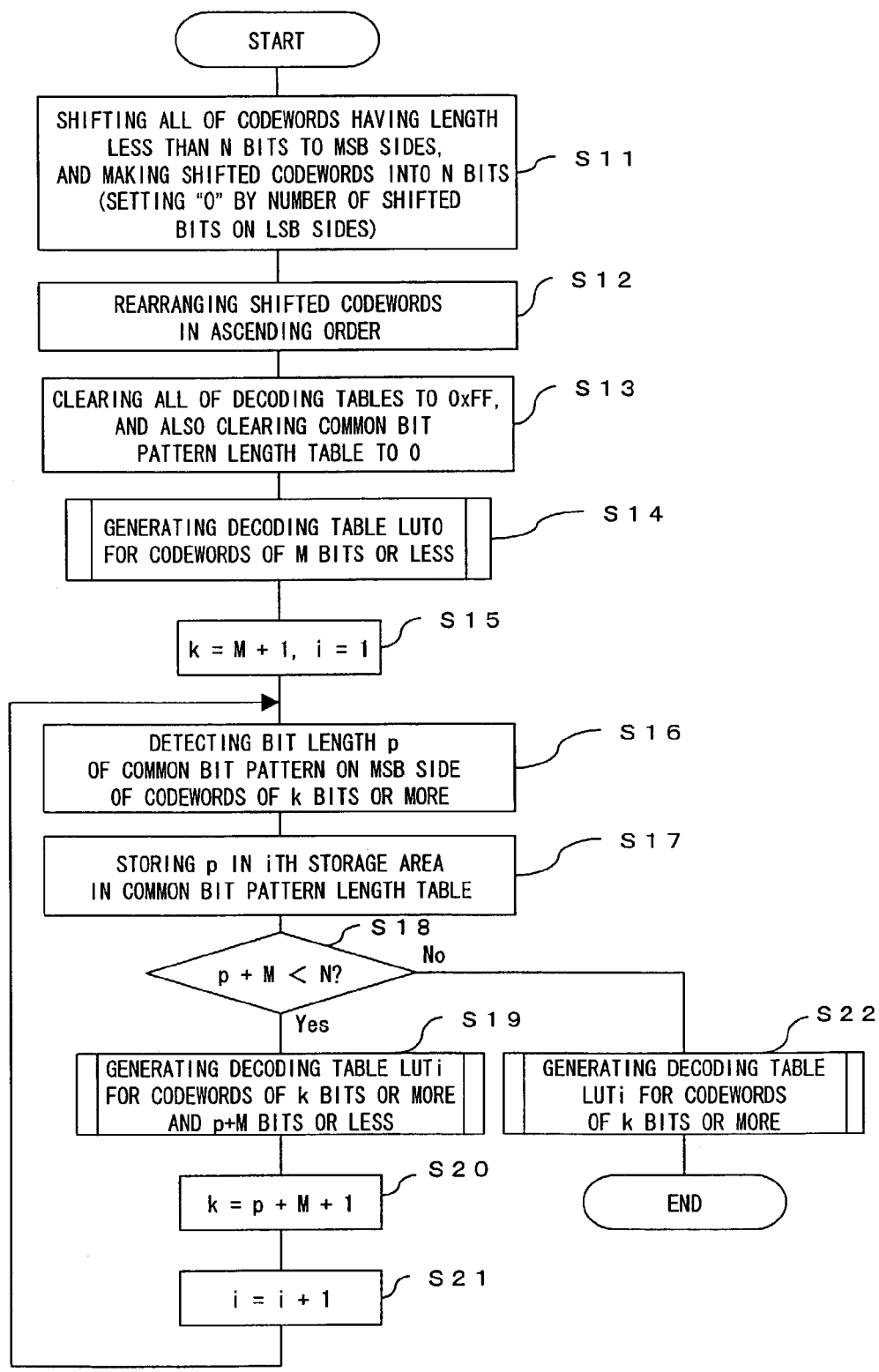
FIG. 13 is a flowchart showing the whole of a table generation process.

FIG. 13 is a flowchart showing the whole of a process for generating decoding tables and a common bit pattern length table. When this process is started in this figure, all of codewords having bit lengths less than the bit length N of the longest codeword are shifted to the MSB sides, and made into N bits in correspondence with the grouping of variable-length codewords, which is explained with reference to FIG. 6, in step S11. Namely, "0" is set on the LSB side by the number of shifted bits. In step S12, the shifted codewords are rearranged in ascending order, so that the order shown in FIG. 12 is obtained. Note that "0s" on the LSB side are omitted in FIG. 12.

In step S13, "FF" as an extension symbol is stored in the storage areas of a bit length and decoded data within all of decoding tables, and the contents stored in the common bit pattern length table are cleared to 0. In step S14, a decoding table LUT0 for the codewords of M bits or less, namely, for the codewords of the group 0 is generated. This decoding table generation process will be described later with reference to FIG. 15.

In step S15, a group number i is set to 1, and a bit length k of the initial codeword stored in a decoding table LUTi corresponding to this group is set to a value obtained by adding 1 to the bit length of an address in the decoding table, namely, the bit length M of extracted data, which is explained with reference to FIG. 7. Then, processes in steps S16 to S21 are repeated.

In step S16, a bit length p of a common bit pattern on the MSB side of codewords of k bits or more, initially 9 bits or more, for example, if M is set to 8 is obtained. In FIG. 12, the bit length of codewords of the group 1, namely, 5 is detected. In step S17, this value is stored in an i(=1)th storage area in the common bit pattern length table. In step S18, it is determined whether or not p+M is less than N. Since p+M is still 13 here, the process therefore goes to step S19 and subsequent steps in case of N=16.

In step S19, a decoding table LUT1 for codewords of k bits or more and p+M bits or less, for codewords of 9 bits or more and 13 bits or less in FIG. 12, namely, for the group 1 is generated. In step S20, p is added to the value of k, and k becomes equal to 14. In step S21, the value of i is incremented, and becomes 2. Then, the processes in and after step S16 are repeated.

In step S16, 9 is detected as the bit length p of the common bit pattern on the MSB side of codewords of 14 bits or more. In step S17, this value is stored in the second area of the common bit pattern length table. In step S18, it is determined whether or not the value of p+M is less than N.

Here, the value of p+M becomes 17, which exceeds the value of N, namely, 16. Therefore, a decoding table for the codewords of k bits or more, namely, 14 bits or more is generated. In FIG. 12, a decoding table LUT2 for the group 2 is generated, and the process is terminated.

FIG. 14 exemplifies a generated common bit pattern length table. This table indicates the value "0" cleared in step S13 of FIG. 13 for the group number 0, and the value of p stored in step S17 for the group numbers 1 and 2.

Figure 16:
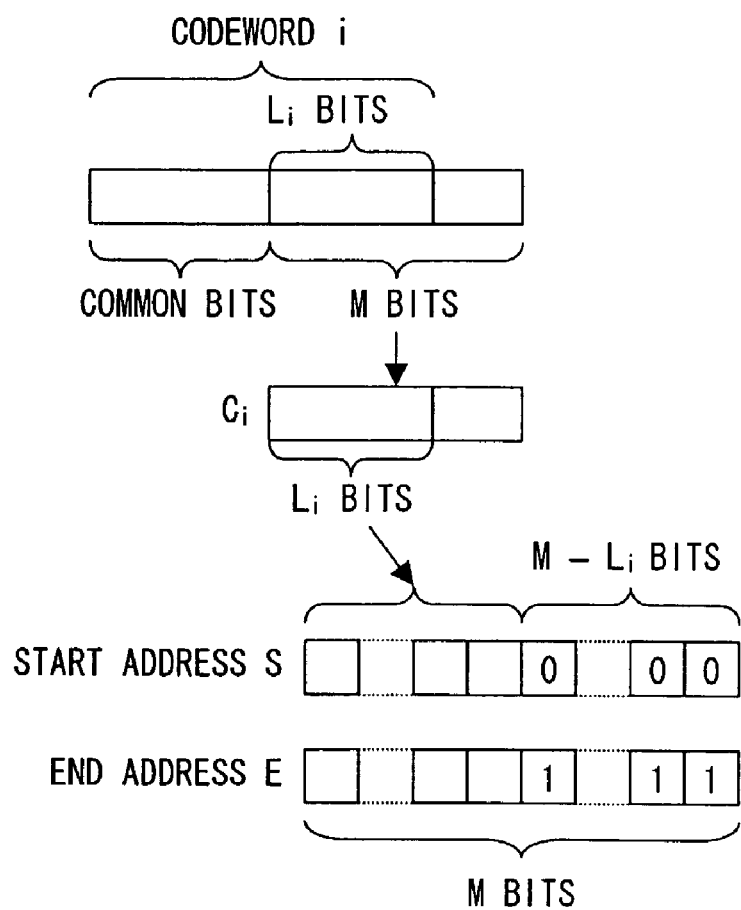
FIG. 16 explains an address setting process in a decoding table.

FIG. 15 is a flowchart showing the details of the decoding table generation process. FIG. 16 explains an address setting process in a decoding table. FIG. 15 shows the decoding table generation process performed when K codewords that configure a group are input. Here, assume that the bits of the input codewords are shifted to align the MSB sides, the shifted codewords are rearranged in ascending order as explained in steps S11 and S12 of FIG. 13, and the contents of a decoding table are initialized by using the extension symbol "FF" as explained in step S13. Operations for generating a decoding table are explained by taking the group 1 shown in FIG. 12 as an example here.

Firstly, in step S31, M bits exclusive of a common bit pattern are extracted from the MSB sides of the input K codewords, namely, 18 codewords in the group 1 of FIG. 12, and the extracted bits are respectively stored, for example, in working areas $C_1$ to $C_k$. An upper portion of FIG. 16 explains this process. That is, M bits obtained by excluding common bits from a codeword i become $C_i$.

In step S32, values obtained by subtracting the bit length of the common bit pattern from the bit lengths of the codewords corresponding to $C_1$ to $C_k$, namely, the codewords before "0s" are added to their LSB sides are set as $L_i$ bits, and the values are respectively stored in working areas $L_1$ to $L_k$. Values 4 to 7 are stored in $L_1$ to $L_{18}$ for the group 1.

In step S33, the result that the address for the $C_1$ becomes the smallest is used, and "00" as the error symbol is set as the decoded data of addresses from the beginning of the decoding table, namely, an address 00000000 in the decoding table of the group 1 shown in FIG. 17 to an address obtained by subtracting "1" from the above described $C_1$ (01100000 corresponding to the value obtained when M−$L_1$=4 bits are set to "0" on the LSB side of the initial codeword of the group 1 shown in FIG. 12), namely, 01011111. In step S34, i which indicates the numbers of the input K codewords is initialized to 1. Processes of steps S35 to S39 are then repeated.

In step S35, as shown in a lower portion of FIG. 16, values obtained by setting all of M−$L_i$ bits to "0" on the LSB side of $C_i$ of the M bits extracted in correspondence with an input codeword are set as a start address S. In step S36, values obtained by setting all of M−$L_i$ bits to "1" are set as an end address E in a similar manner. In FIG. 17, in correspondence with a codeword having a code number 18, a start adress is obtained by setting "0000" on the lower side of an adress 0110, which is obtained by excluding 5 bits on the MSB of the codeword, and an end adress is obtained by setting "1111" on the lower side of the adress 0110.

In step S37, the bit length and the decoded data of the codeword corresponding to $C_i$ are stored in all of the addresses from S to E in the decoding table. Namely, in FIG. 17, 9 bits and, for example, "14" corresponding to the 18th codeword are respectively stored as the code length for all of the addresses set in steps S35 and S36, and as the decoded data.

In step S38, the value of i is incremented. In step S39, it is determined whether or not i is equal to or less than K, namely, whether or not i is within the range of the input K codewords. If it is determined that i is within the range of the K codewords, the processes in steps S35 to S39 are repeated. If it is determined that i exceeds K in step S39, the process is terminated.

An address area on the LSB side in FIG. 17 is explained. Since the bit length of the common bit pattern of the group 1 is 5 in FIG. 12, codewords having bit lengths of up to 13 bits must be originally included. However, no codewords having a bit length of 13 bits are used in the example of the codewords in FIG. 12, and the extension symbol "FF" is kept to be stored as explained in step S13 of FIG. 13 in the range from 11110000 to 11111111 as an address range in the case where variable-length codeword data of 13 bits are used.

As described above, "FF" stored as the initial value is kept to be stored as the decoded data of an address which does not correspond to a used variable-length codeword, namely, an existing codeword, and the "FF" can be used as an extension symbol which indicates a correspondence with a codeword having a longer bit length. Additionally, if an area higher than an address, for which a code length and decoded data corresponding to an existing codeword are stored, exists at the beginning of a group, all of values of the decoded data corresponding to that address become "00", namely, the error symbol. Therefore, it is detected that an unexisting codeword cannot be decoded if it is attempted to be decoded.

Namely, a code length and decoded data are obtained for a variable-length codeword belonging to a group, whereas "FF" is obtained respectively as a code length and decoded data for a codeword longer than a variable-length codeword within a group. For an illegal codeword, "FF" and "00" are obtained respectively as a code length and decoded data. Therefore, a distinction can be made between these cases.

FIG. 18 shows the decoding table of the group 0, whereas FIG. 19 shows the decoding table of the group 2. Because no address exists in a high-order portion of the start address 00000000 corresponding to the initial codeword of the group 0 shown in FIG. 12, the error symbol is not stored in FIG. 18. Additionally, the extension symbol "FF" is kept to be stored as decoded data in an address range of up to 8 bits on the lower-order side of the address corresponding to the codeword having the number 17, namely, the address range from 11111011 to 11111111.

In the decoding table of the group 2 shown in FIG. 19, the start address corresponding to the initial codeword of the group 2 shown in FIG. 12 is 00000000, whereas the end address corresponding to the last codeword is 11111111. Therefore, neither the error symbol nor the extension symbol is stored as decoded data.

Figure 20:
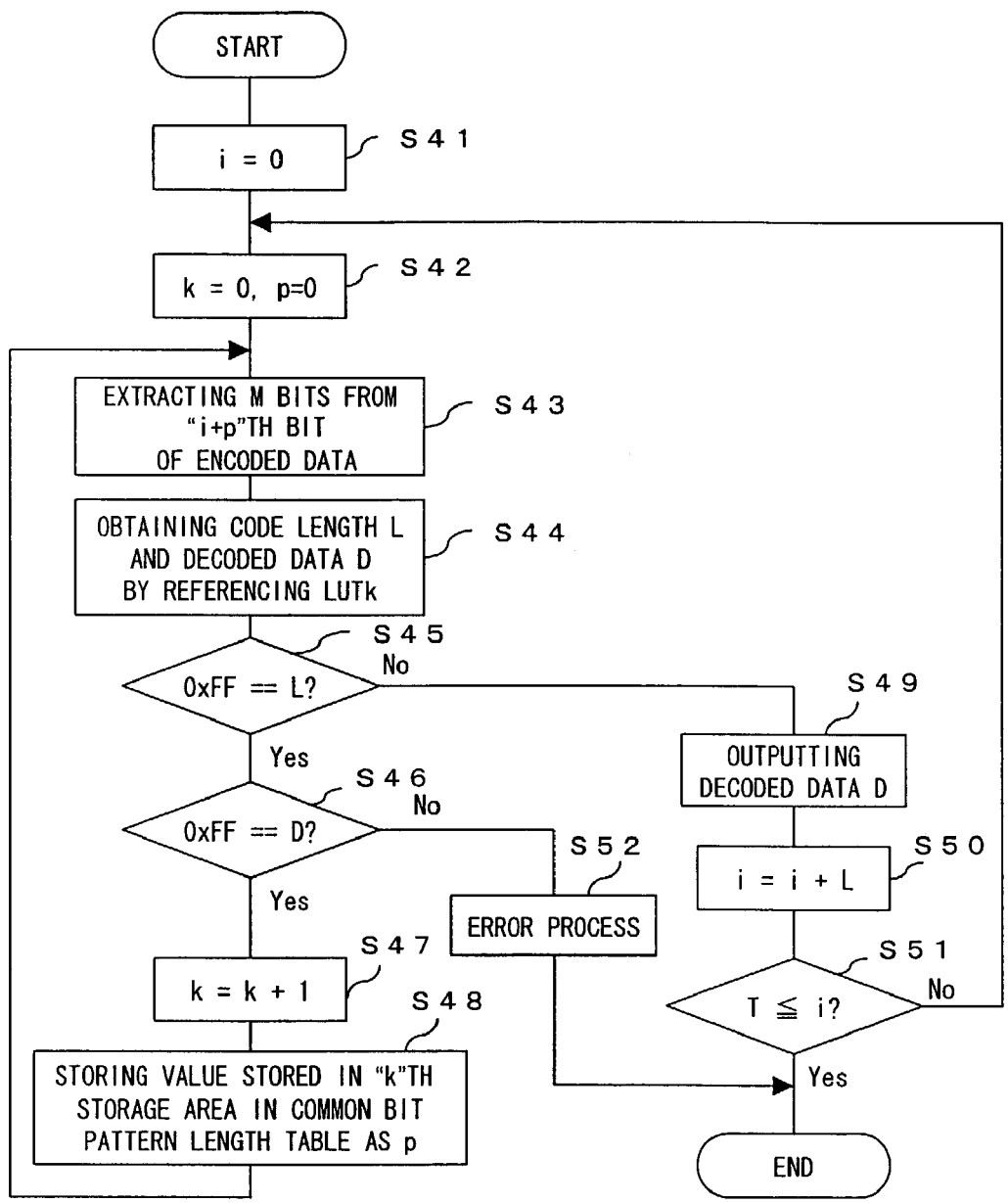
FIG. 20 is a flowchart showing a variable-length encoded data decoding process.

FIG. 20 is a flowchart showing the details of the process for decoding input variable-length encoded data This process is explained by assuming that the bit length of the entire input encoded data is T, a code extraction start position used by the code extracting unit 21, namely, a bit position which indicates the decoding start of codeword data is i (=0~T−1), and the group number of a decoding table is k in FIG. 20.

In step S41, the bit position i at which decoding is started is set to "0", namely, the initial position of the entire input encoded data by the decoding controlling unit 22 shown in FIG. 10. In step S42, after the group number k of the decoding table is set to "0", and the bit length p of a common bit pattern is set to "0", processes in steps S43 to S48 are repeated.

In step S43, M bits are extracted from an "i+p"th bit position of the encoded data input by the decoding controlling unit 22, here, for example, 8 bits are extracted from the 0th bit position. In step S44, a decoding table LUT0 of the group 0 is referenced by the decoding table referencing unit 26, and a code length L and decoded data D are obtained.

In step S45, it is determined by the decoding controlling unit 22 whether or not the code length L matches the extension symbol "FF". Additionally, in step S46, it is determined whether or not the decoded data D matches the extension symbol "FF".

If both of results of these determinations are "Yes", the extension symbol is determined to be extracted by the decoding controlling unit 22. After the value of k is incremented to reference the next decoding table in step S47, a "k"th value, here, the 1st value in the common bit pattern length table is stored as the value of p by the decoding controlling unit 22 in step S48, and the processes in and after step S43 are repeated. Namely, 8 bits are extracted from "i+p=5"th bit position of the encoded data in step S43, and the decoding table LUT1 of the group 1 is referenced in step S44, so that the code length L and the decoded data D are obtained.

For example, if the code length L is determined not to be the extension symbol "FF" in step S45, it means that decoding has been performed. Therefore, the decoded data D is output by the decoding controlling unit 22 in step S49. In step S50, the bit length L of the variable-length codeword corresponding to the decoded data is added to the decoding start bit position i. In step S51, it is determined whether or not the decoding start bit position i becomes equal to or more than the bit length T of the entire encoded data. If the decoding start bit position i does not become equal to or more than the bit length T, the processes in and after step S42 are repeated. If the decoding start bit position i is determined to become equal to or more than the bit length T, the process is terminated. Here, the value of i takes values 0 to T−1 based on the bit length T of the entire encoded data as described above. If the value of i becomes equal to or more than T, it means that the decoding process for the input encoded data is terminated.

If the decoded data D obtained in step S44 is determined not to be the extension symbol "FF" by the decoding controlling unit 22 in step S46, and if the bit length L is determined to be the extension symbol "FF" in step S45, this means that the decoded data D is the error symbol "00". Therefore, this data is determined to be an error as an illegal codeword. After the error process is performed by the decoding controlling unit 22 in step S52, the process is terminated.

As described above, in this preferred embodiment, the size of a decoding table for decoding encoded data can be reduced by using an address having a bit length shorter than the longest codeword length. For example, if the longest codeword length is 16 bits, a decoded data storage area for 65536 addresses is required with a conventional decoding method. However, according to this preferred embodiment, a storage area for up to 2304 (256×9) addresses is sufficient, and a conventional storage area used to store decoding tables can be reduced to approximately $\frac{1}{28}$.

When variable-length encoding is performed, a shorter codeword is generally assigned to data having a higher appearance frequency. Therefore, the peak of the appearance frequencies of codewords configuring variable-length encoded data exists in a portion where a bit length is short in many cases.

For example, if codewords whose longest codeword length is 16 bits are used, the use frequency of codewords of 4 to 6 bits becomes the highest, and the percentage of codewords of 8 bits or less reaches 80 to 90 in many cases.

Therefore, by setting the bit length of data extracted from variable-length encoded data as a multiple of 4 bits, the decoding process for the majority of the data can be completed by referencing a decoding table only once.

Additionally, if the bit length of data extracted from variable-length encoded data is set as 8 bits, a decoding table can be efficiently stored in a memory element such as a RAM, a ROM, etc. As a result, excess bit operations for decoding performed by a data processing device such as a general microprocessor, etc. intended to control decoding become unnecessary, so that the decoding process can be performed efficiently.

Figure 21:
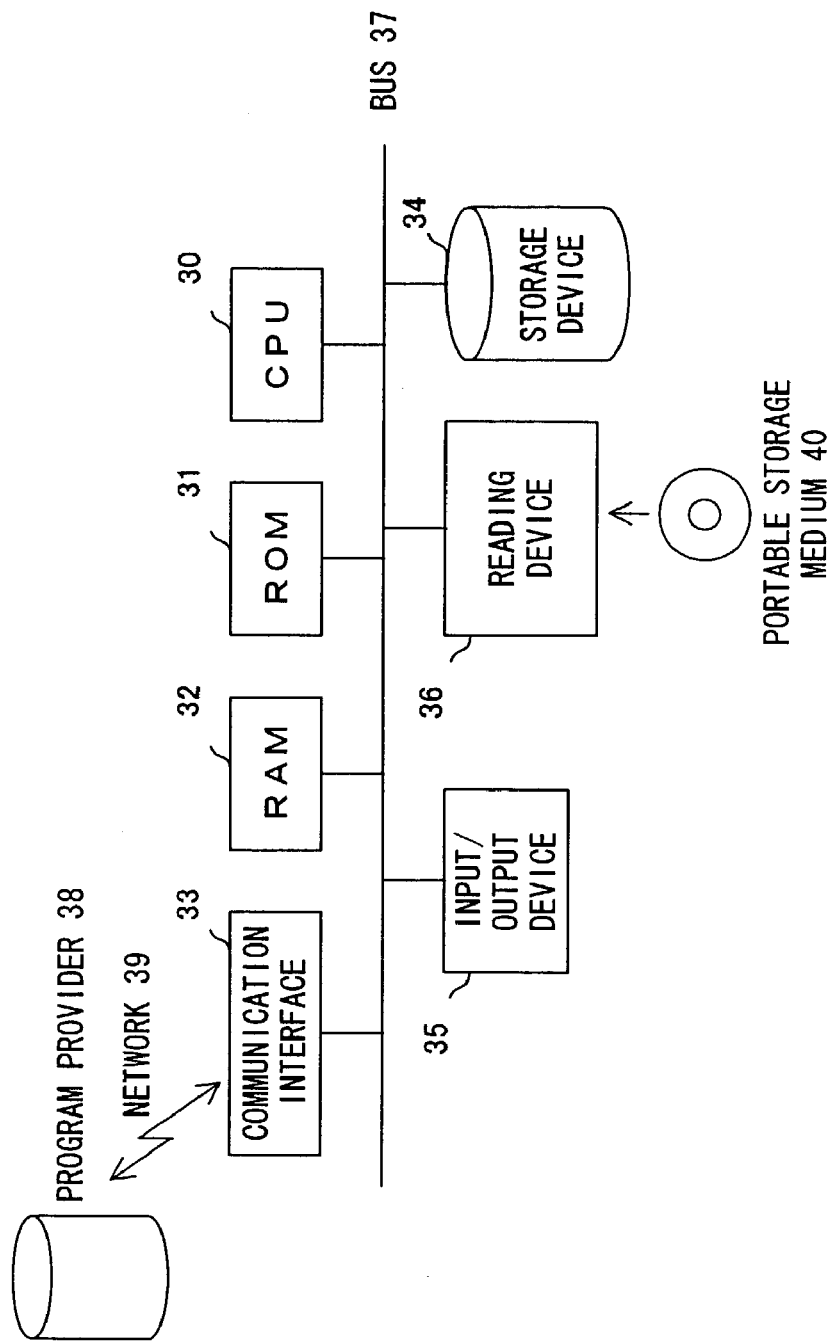
FIG. 21 explains the loading of a program for implementing the present invention into a computer.

Up to this point, the details of the variable-length data decoding apparatus and decoding method according to the present invention are described. This variable-length encoded data decoding apparatus can be configured as a general computer system as a matter of course. FIG. 21 is a block diagram showing the configuration of such a computer system, namely, a hardware environment.

In FIG. 21, the computer system is configured by a central processing unit (CPU) 30, a read-only memory (ROM) 31, a random access memory (RAM) 32, a communications interface 33, a storage device 34, an input/output device 35, a reading device 36 for a portable storage medium, and a bus 37 to which all of these constituent elements are connected.

As the storage device 34, a storage device of various types such as a hard disk, a magnetic disk, etc. is available. The programs represented by the flowcharts shown in FIGS. 11, 13, 15, and 20 are stored in such a storage device 34 or a ROM 31, and the CPU 30 executes these programs, whereby decoding of variable-length encoded data according to the present invention can be implemented.

Such programs may be stored, for example, in the storage device 34 via a network 39 and the communications interface 33 from a program provider 38 side. Or, the programs may be stored onto a marketed and distributed portable storage medium 40, set in the reading device 36, and executed by the CPU 30. As the portable storage medium 40, a storage medium of various types such as a CD-ROM, a flexible disk, an optical disk, a magneto-optical disk, etc. is available. The programs stored onto such a storage medium are read by the reading device 36, so that the decoding of variable-length encoded data according to the present invention can be implemented.

As described above in detail, according to the present invention, decoding of variable-length encoded data is performed by using a plurality of decoding tables that include addresses having bit lengths shorter than the longest codeword among used codewords, and a common bit pattern length table that includes the bit lengths of common bit patterns of codewords corresponding to the respective decoding tables. As a result, the size of a decoding table can be significantly reduced, and decoding of variable-length encoded data can be performed with a smaller memory capacity in comparison with the case where encoded data is extracted and decoded with the same bit length as the longest codeword length as conventional, which greatly contributes to improvements in the practicability of a decoding system for variable-length encoded data.

What is claimed is:

1. A variable-length encoded data decoding apparatus, comprising:
   a common bit pattern length storing unit storing bit lengths of common bit patterns that respectively correspond to groups, when codewords, whose bit lengths exclusive of the common bit patterns on MSB sides are equal to or less than a predetermined value, among all of used codewords are classified into the groups in correspondence with the respective common bit patterns;

a decoding table storing unit storing a table for storing a bit length and decoded data of a codeword in correspondence with the codeword in each of the groups; and an encoded data decoding unit decoding input variable-length encoded data by using contents stored in said common bit pattern length storing unit, and said decoding table storing unit.

2. The variable-length encoded data decoding apparatus according to claim 1, wherein said decoding table storing unit stores a table for storing a bit length and decoded data of a codeword in correspondence with an address having, on an MSB side, a portion obtained by excluding a common bit pattern from the codeword of a group corresponding to each of the common bit patterns.

3. The variable-length encoded data decoding apparatus according to claim 2, wherein:

said decoding table storing unit stores an extension symbol as decoded data for an address which does not correspond to a codeword belonging to a group among addresses in a lowest-order side address range within the table, and also stores an error symbol as decoded data for an address which does not correspond to a codeword belonging to a group in a highest-order side address range within the table; and said encoded data decoding unit decodes input encoded data by using a table for a common bit pattern second longest to a common bit pattern corresponding to the table in which the extension symbol is stored upon detection of the extension symbol when decoding the input encoded data, and determines a data decoding error upon detection of the error symbol when decoding the input encoded data.

4. The variable-length encoded data decoding apparatus according to claim 1, wherein a bit length of the predetermined value is a multiple of 4.

5. A variable-length encoded data decoding method, comprising:

classifying codewords, whose bit lengths exclusive of common bit patterns on MSB sides are equal to or less than a predetermined value, among used codewords into groups in correspondence with the respective common bit patterns;

generating a common bit pattern length table for storing bit lengths of the common bit patterns that respectively correspond to the groups;

generating a decoding table for storing a bit length and decoded data of a codeword in correspondence with the codeword within each of the groups; and decoding input encoded data by using the common bit pattern length table, and the decoding table.

6. The variable-length encoded data decoding method according to claim 5, wherein in generation of the decoding table, a bit length and decoded data of a codeword are stored in correspondence with an address having, on an MSB side, a portion obtained by excluding a common bit pattern from the codeword of a group corresponding to each of the common bit patterns.

7. The variable-length encoded data decoding method according to claim 6, wherein:

in generation of the decoding table, an extension symbol is stored as decoded data for an address which does not correspond to a codeword belonging to a group among addresses in a lowest-order side address range within the table, and an error symbol is stored as decoded data for an address which does not correspond to a codeword belonging to a group in a highest-order side address range within the table; and in decoding of the encoded data, input encoded data is decoded by using a table for a common bit pattern second longest to a common bit pattern corresponding to the table in which the extension symbol is stored upon detection of the extension symbol when the input encoded data is decoded, and a data decoding error is determined upon detection of the error symbol when the input encoded data is decoded.

8. The variable-length encoded data decoding method according to claim 5, wherein a bit length of the predetermined value is a multiple of 4.

9. A program used by a computer decoding variable-length encoded data, causing the computer to execute a process, the process comprising:

classifying codewords, whose bit lengths exclusive of common bit patterns on MSB sides are equal to or less than a predetermined value, among used codewords into groups in correspondence with the respective common bit patterns;

generating a common bit pattern length table for storing bit lengths of the common bit patterns that respectively correspond to the groups, and a decoding table for storing a bit length and decoded data of a codeword in correspondence with the codeword within each of the groups; and decoding input encoded data by using the common bit pattern length table, and the decoding table.

10. A computer-readable portable storage medium used by a computer decoding variable-length encoded data, on which is recorded a program for causing the computer to execute a process, the process comprising:

classifying codewords, whose bit lengths exclusive of common bit patterns on MSB sides are equal to or less than a predetermined value, among used codewords into groups in correspondence with the respective common bit patterns;

generating a common bit pattern length table for storing bit lengths of the common bit patterns that respectively correspond to the groups, and a decoding table for storing a bit length and decoded data of a codeword in correspondence with the codeword within each of the groups; and decoding input encoded data by using the common bit pattern length table, and the decoding table.

* * * * *

UNITED STATES PATENT AND TRADEMARK OFFICE
CERTIFICATE OF CORRECTION

PATENT NO. : 7,148,820 B2  
APPLICATION NO. : 10/412244  
DATED : December 12, 2006  
INVENTOR(S) : Kenichiro Sakai et al.

Page 1 of 1

It is certified that error appears in the above-identified patent and that said Letters Patent is hereby corrected as shown below:

On the cover page, item

(74) Attorney, Agent, or Firm, change "Stass" to --Staas--

Signed and Sealed this

Tenth Day of April, 2007

JON W. DUDAS  
*Director of the United States Patent and Trademark Office*